United States Patent
Kashiwaya et al.

(10) Patent No.: US 7,052,732 B2
(45) Date of Patent: *May 30, 2006

(54) METHOD FOR PRODUCING A PIEZOELECTRIC ELEMENT

(75) Inventors: Toshikatsu Kashiwaya, Inazawa (JP); Mutsumi Kitagawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 146 days.

This patent is subject to a terminal disclaimer.

(21) Appl. No.: 10/666,879

(22) Filed: Sep. 19, 2003

(65) Prior Publication Data

US 2004/0205948 A1    Oct. 21, 2004

Related U.S. Application Data

(60) Division of application No. 10/072,297, filed on Feb. 7, 2002, now Pat. No. 6,731,049, which is a continuation-in-part of application No. 09/953,674, filed on Sep. 17, 2001, now Pat. No. 6,565,997.

(30) Foreign Application Priority Data

Sep. 20, 2000  (JP)  ............................. 2000-286115
Dec. 20, 2001  (JP)  ............................. 2001-388313

(51) Int. Cl.
  *B05D 5/12*   (2006.01)
  *B05D 3/02*   (2006.01)
  *H04R 17/00*  (2006.01)

(52) U.S. Cl. ................ 427/100; 427/376.2; 427/376.6; 427/383.5; 29/25.35

(58) Field of Classification Search ................ 427/100, 427/376.2, 376.6, 383.5; 252/62.9; 501/136; 29/25.35
See application file for complete search history.

(56) References Cited

U.S. PATENT DOCUMENTS

| | | | |
|---|---|---|---|
| 3,775,531 A |    | 11/1973 | Smith |
| 5,275,988 A |    | 1/1994  | Mori et al. |
| 5,376,857 A | *  | 12/1994 | Takeuchi et al. ............ 310/328 |
| 5,691,593 A | *  | 11/1997 | Takeuchi et al. ............ 310/328 |
| 6,104,128 A |    | 8/2000  | Fujii et al. |
| 6,278,225 B1 |   | 8/2001  | Nagaya et al. |

(Continued)

FOREIGN PATENT DOCUMENTS

EP    0 344 978    12/1989

(Continued)

OTHER PUBLICATIONS

Ouchi et al., "Piezoelectric Properties of Pb(Mg1/3Nb2/3)O3-PbTiO3-PbZrO3 Ceramics Modified with Certain Additives", Journal of American Ceramic Society, vol. 49, No. 11, Nov. 21, 1966.*

(Continued)

*Primary Examiner*—Brian K. Talbot
(74) *Attorney, Agent, or Firm*—Burr & Brown

(57) ABSTRACT

A method for producing a piezoelectric element by superposing a piezoelectric material made of a piezoelectric ceramic composition containing a $PbMg_{1/3}Nb_{2/3}O_3$—$PbZrO_3$—$PbTiO_3$ ternary system solid solution composition represented by the general formula $Pb_x(Mg_{y/3}Nb_{2/3})_aTi_bZr_cO_3$ as a main component, and 0.05 to 10.0 mass % of NiO on a ceramic substrate or on an electrode formed on the ceramic substrate, and subjecting the superposed piezoelectric material to a thermal treatment in an atmosphere where 0.03–0.5 mg/cm$^3$ (NiO conversion amount per unit volume of a space in a container) of an atmosphere-controlling material having the same composition as the piezoelectric material is coexisted.

2 Claims, 6 Drawing Sheets

U.S. PATENT DOCUMENTS 6,492,763 B1    12/2002    Kim et al.
6,495,947 B1    12/2002    Kim et al.

FOREIGN PATENT DOCUMENTS

| | | |
|---|---|---|
| EP | 0 615 294 A1 | 9/1994 |
| EP | 0 954 038 A1 | 11/1999 |
| EP | 1 191 611 A2 | 3/2002 |
| JP | 42-20029 | 10/1967 |
| JP | 44-17103 A2 | 7/1969 |
| JP | 50-003519 | 2/1975 |
| JP | 50-3519 | 2/1975 |
| JP | 53-063597 A1 | 6/1978 |
| JP | 60102779 | 6/1985 |
| JP | 60102779 A | 6/1985 |
| JP | 07-315926 A1 | 12/1995 |
| JP | 07315926 A | 12/1995 |
| JP | 09-157018 | 6/1997 |
| JP | 11-029357 | 2/1999 |
| JP | 11029357 A | 2/1999 |
| JP | 2000-244031 | 9/2000 |
| JP | 2001-080070 A1 | 3/2001 |
| JP | 3512379 B2 | 1/2004 |
| WO | 01/93345 A1 | 12/2001 |

OTHER PUBLICATIONS

Ouchi, Hiromu, et al. *Piezoelectric Properties of Pb $(Mg_{1/3}Nb_{2/3})O_3$ -$PbTiO_3$ -$PbZrO_3$ Ceramics Modified with Certain Additives*, Journal of the American Ceramic Society, Nov. 21, 1966, vol. 49, No. 11, 577-582.

Gui Zhilun, Li Longtu, Lin Hongqing and Zhang Xiaowen, "Low Temperature Sintering of Lead Magnesium Nickel Niobate Zirconate Titanate (PMN-PNN-PZT) Piezoelectric Ceramic, with High Performances," *Department of Chemical Engineering, Tsinghua University, Beijing, People's Republic of China, Ferroelectrics*, 1990, vol. 101, pp. 93-99.

Ouchi et al., "Piezoelectric Properties of Pb (Mg1/3Nb2/3) 03-PbTi03-PbZr03 Ceramics Modified with Certain Additives," *Journal of the American Ceramic Society, American Ceramic Society, Columbus, United States*, vol. 49, No. 11, 1966, pp. 577-582.

Ouchi et al., "Piezoelectric Properties of Pb (Mg1/3Nb2/3) O3-PbTiO3-PbZrO3 Solid Solution Ceramics," *Journal of the American Ceramic Society, American Ceramic Society, columbus, United States*, vol. 48, No. 12, 1965, pp. 630-635.

\* cited by examiner

US 7,052,732 B2

METHOD FOR PRODUCING A PIEZOELECTRIC ELEMENT

CROSS-REFERENCE OF RELATED APPLICATIONS

This application is a division of U.S. patent application Ser. No. 10/072,297, filed Feb. 7, 2002, now U.S. Pat. No. 6,731,049, which is a continuation-in-part application of U.S. patent application Ser. No. 09/953,674, filed on Sep. 17, 2001, now U.S. Pat. No. 6,565,997, the entireties of which are incorporated herein by reference.

This application also claims the benefit of Japanese Application No. 2000-286,115, filed Sep. 20, 2000, and Japanese Application No. 2001-388,313, filed Dec. 20, 2001, the entireties of which are incorporated herein by reference.

BACKGROUND OF INVENTION AND RELATED ART

The present invention relates to a piezoelectric element. More particularly, the present invention relates to a piezoelectric portion which has very high piezoelectric properties, and which has a high rate of increase of displacement as an actuator in the case of applying a large electric field and a high decomposability as a sensor in the case that a great force is applied.

In recent years, piezoelectric elements have been used in ink jet printer heads, speakers, microphones, etc.

As the piezoelectric elements, there are generally known those comprising a ceramic substrate, a piezoelectric portion made of a piezoelectric ceramic composition, formed on the substrate, and electrodes electrically connected to the piezoelectric portion. As to the piezoelectric ceramic composition constituting the piezoelectric portion, various improved compositions have been disclosed.

For example, a $Pb(Mg_{1/3}Nb_{2/3})O_3$—$PbTiO_3$—$PbZrO_3$ ternary system solid solution composition and a piezoelectric ceramic composition wherein part of Pb in the above composition is replaced by Sr, La, etc., were disclosed [Japanese Patent Publication S44-17103, Japanese Patent Publication S45-8145]. With regard to a piezoelectric portion itself which are the most important factor determining the piezoelectric element properties of the piezoelectric element, a piezoelectric element having excellent piezoelectric properties (e.g. piezoelectric d constant is expected.

When a piezoelectric element is produced actually by superposing a piezoelectric material made of the above piezoelectric ceramic composition on a ceramic substrate and then subjecting the piezoelectric material to heat treatment, the obtained piezoelectric portion has a low density, and therefore, there have been pointed out such a problem that the piezoelectric element has a low flexural displacement or, when a voltage is applied thereto, it causes dielectric breakdown at the low density area. In particular, this problem is remarkable in the case of a piezoelectric element having a structure that a negative electrode and a positive electrode are disposed between piezoelectric portions alternatively, and its improvement has been strongly demanded.

In addition, sufficient piezoelectric properties cannot always be obtained with a piezoelectric portion made of the aforementioned piezoelectric ceramic composition, and there have been such a problem that when a voltage is raised to increase a flexural displacement, an increase of the flexural displacement obtained is very small relative to an increase of voltage on a side of a high electric field of 4 kV/mm or more.

Hence, there has been proposed a piezoelectric element produced by previously heat-treating a piezoelectric material made of the above piezoelectric ceramic composition to produce a piezoelectric portion, and then attaching this piezoelectric portion onto a ceramic substrate (Japanese Patent Application H11-29357).

In this piezoelectric element, attention was paid to a fact that use of a ceramic substrate impairs the densification of a piezoelectric portion. Thus, the piezoelectric element was accordingly improved in piezoelectric properties by means of obtaining a dense piezoelectric portion where a piezoelectric material made of a piezoelectric ceramic composition was previously heat-treated.

In this piezoelectric element, however, it is necessary to use an inorganic or organic adhesive at the time of attaching the piezoelectric onto the ceramic substrate. Therefore, there have been such problems that the adhesive impairs the vibration transmittability between the ceramic substrate and the piezoelectric or the adhesive components infiltrate into the piezoelectric or the ceramic substrate, deteriorating their properties.

In addition, in this piezoelectric element, no consideration is given to a piezoelectric ceramic composition itself constituting a piezoelectric portion. Therefore, there has been a problem that sufficient piezoelectric properties cannot always be obtained like the aforementioned piezoelectric element, and further, an increase of the flexural displacement obtained is very small relative to an increase of voltage in a region of a high electric field.

SUMMARY OF THE INVENTION

The present invention has been completed in view of the aforementioned problems and aims at providing a piezoelectric element which has very high piezoelectric properties, which is excellent in vibration transmittability between a substrate and a piezoelectric portion, and where linearity of a flexural displacement to voltage is ensured till a high electric region, and a method for production thereof.

Incidentally, in a piezoelectric element of the present invention, the aforementioned effect is great in a structure of laminating piezoelectric portions and electrodes alternatively to give a plurality of layers. The piezoelectric element can be suitably used for an actuator, a sensor, etc.

The present inventor made a study in order to solve the aforementioned problems. As a result, the present inventor found out that when there is used, as a piezoelectric material, a piezoelectric ceramic composition composed mainly of a $PbMg_{1/3}Nb_{2/3}O_3$—$PbZrO_3$—$PbTiO_3$ ternary system solid solution composition of particular formulation and containing NiO in a particular proportion, the densified piezoelectric portion can be obtained even when a piezoelectric material is superposed on a substrate and then heat-treated, whereby the aforementioned problems can be solved. The present invention has been completed based on the above finding.

That is, according to the present invention, there is provided a piezoelectric element including a ceramic substrate, and a piezoelectric portion made of a piezoelectric ceramic composition containing a $PbMg_{1/3}Nb_{2/3}O_3$—$PbZrO_3$—$PbTiO_3$ ternary system solid solution composition having an average particle diameter of 1–10 μm with a maximum particle diameter being 5 times as large as the average particle diameter or less and being represented by the chemical formula discussed below as a main component. The piezoelectric portion contains 0.05 to 10.0 mass % of NiO. An electrode is electrically connected to the piezoelectric portion, and the piezoelectric portion is solidly attached to the ceramic substrate directly or via the electrode.

The piezoelectric ceramic composition is represented by the following general formula: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in the coordinates with coordinate axes of said a, b and c, and a+b+c=1.00.

According to the present invention, there is further provided a piezoelectric element including a ceramic substrate, and a plurality of piezoelectric portions made of a piezoelectric ceramic composition containing a $PbMg_{1/3}Nb_{2/3}O_3$—$PbZrO_3$—$PbTiO_3$ ternary system solid solution composition represented by the chemical formula discussed below as a main component. The plurality of piezoelectric portions contain 0.05 to 10.0 mass % of NiO, and include a plurality of electrodes thereon. The plurality of piezoelectric portions are laminated with interposing negative electrodes and positive electrodes of the plurality of electrodes alternately in each gap between the piezoelectric portions provided in stories and a lowermost piezoelectric portion is solidly attached to the ceramic substrate directly or via said electrode.

The piezoelectric ceramic composition is represented by the following general formula: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said a, b and c, and a+b+c=1.00.

Incidentally, in a piezoelectric element of this lamination structure, it is preferable that a ternary system solid solution composition has an average particle diameter of 1–10 μm with the maximum particle diameter being 5 times as large as the average particle diameter or less.

According to the present invention, there is still further provided a piezoelectric element including a ceramic substrate, and a piezoelectric portion made of a piezoelectric ceramic composition containing a $PbMg_{1/3}Nb_{2/3}O_3$—$PbZrO_3$—$PbTiO_3$ ternary system solid solution composition represented by the chemical formula discussed below as a main component. The plurality of piezoelectric portions contain 0.05 to 10.0 mass % of NiO, and said piezoelectric ceramic composition contains particles having NiO as a main component on the surface and/or in the interior thereof. An electrode is electrically connected to the piezoelectric portion, and said piezoelectric portion is solidly attached to the ceramic substrate directly or via the electrode.

The piezoelectric ceramic composition is represented by the following general formula: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said a, b and c, and a+b+c=1.00.

Also, in a piezoelectric element where the NiO particles are present, it is preferable that a ternary system solid solution composition has an average particle diameter of 1–10 μm with the maximum particle diameter being 5 times as large as the average particle diameter or less. In addition, a particle having NiO as the main component may include only NiO or NiO with MgO solid solution.

In any of piezoelectric elements of the present invention, it is preferable that Ni is dispersed in the piezoelectric ceramic composition in such a concentration gradient that the concentration of Ni becomes higher from the interface between the piezoelectric portion and the substrate towards the thickness direction of the piezoelectric portion.

Pb in the piezoelectric ceramic composition may be replaced by at least one kind of element selected from the group consisting of Sr, Ca and Ba, by 2 to 10 mole %. Pb in the piezoelectric ceramic composition may also be replaced by La by 0.2 to 1.0 mole %.

It is preferable that the substrate has a thickness of 3 μm to 1 mm, that the piezoelectric portion has a thickness of 1 to 300 μm, that the ratio of the thickness of the substrate to the thickness of the piezoelectric portion (the thickness of the substrate/the thickness of the piezoelectric portion) is 0.1 to 30, and that a cross-section of the substrate in the thickness direction has a W-like shape having three inflection points.

According to the present invention, there is provided a method for producing a piezoelectric element including the steps of superposing a piezoelectric material containing a $PbMg_{1/3}Nb_{2/3}O_3$—$PbZrO_3$—$PbTiO_3$ ternary system solid solution composition represented by the chemical formula discussed below as a main component, the piezoelectric material contains 0.05 to 10.0 mass % of NiO on a ceramic substrate or on an electrode formed on the ceramic substrate, and subjecting the superposed piezoelectric material to a thermal treatment in an atmosphere where 0.03–0.5 mg/cm³ (NiO conversion amount per unit volume of a space in a container) of a atmosphere-controlling material having the same composition as the piezoelectric material is coexisted.

The piezoelectric material composition is represented by the following general formula: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said a, b and c, and a+b+c=1.00.

A method for producing a piezoelectric element includes the steps of superposing a piezoelectric material containing a $PbMg_{1/3}Nb_{2/3}O_3$—$PbZrO_3$—$PbTiO_3$ ternary system solid solution composition represented by the chemical formula discussed below as a main component, the piezoelectric material contains 0.05 to 10.0 mass % of NiO on a ceramic substrate or on an electrode formed on the ceramic substrate, and subjecting the superposed piezoelectric material to a thermal treatment in an atmosphere wherein 0.03–0.5 mg/cm³ (NiO conversion amount per unit volume of a space in a container) of a atmosphere-controlling material having the same composition as the piezoelectric material is coexisted as a container for housing said electrode on which the piezoelectric material is superposed and a setter for mounting the piezoelectric material thereon.

The piezoelectric material composition is represented by the following general formula: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said a, b and c, and a+b+c=1.00.

The piezoelectric element according to the present invention can be used for condensers or various sensors, as a dense and small dielectric element or pyroelectric element.

BRIEF DESCRIPTION OF THE DRAWINGS

FIG. 1(a) is a plan view, and FIG. 1(b) is a sectional view taken along the X–X' line of FIG. 1(a).

FIG. 2(a) is a plan view, and FIG. 2(b) is a sectional view taken along the X–X' line of FIG. 2(a).

FIG. 3(a) is a plan view, and FIG. 3(b) is a sectional view taken along the X–X' line of FIG. 3(a).

FIG. 4(a) is a plan view, and FIG. 4(b) is a sectional view taken along the X–X' line of FIG. 4(a).

FIG. 5(a) is a plan view, and FIG. 5(b) is a sectional view taken along the X–X' line of FIG. 5(a).

DETAILED DESCRIPTION OF THE INVENTION

Embodiments of the present invention are described below with reference to the drawings.

Figure 1A:
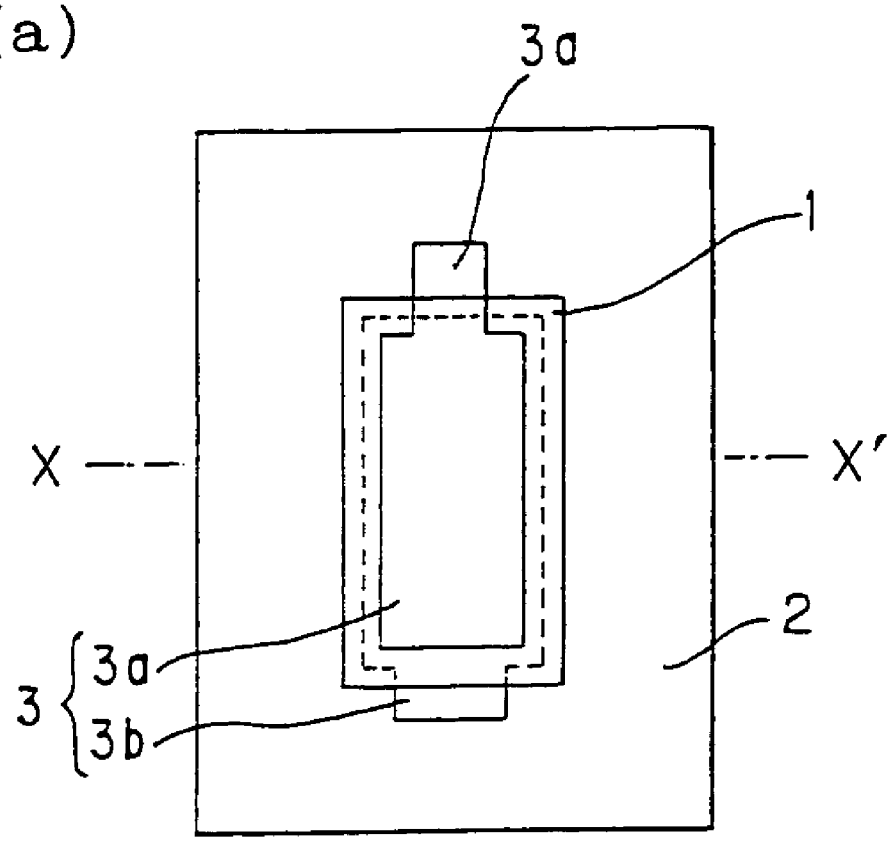
FIGS. 1(a) and 1(b) are explanatory views schematically showing an embodiment of the piezoelectric element of the present invention.
Figure 1B:
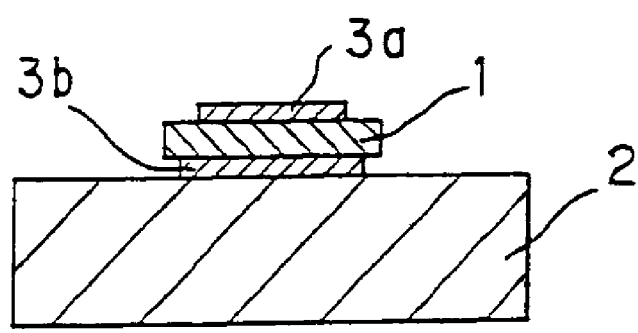

As shown in FIG. 1(a)(b), the piezoelectric element of the present invention is provided with: a ceramic substrate 2, a piezoelectric portion 1 composed of a specific piezoelectric ceramic composition, and electrodes 3 (3a and 3b). The electrodes 3 (3a and 3b) are electrically connected to the piezoelectric portion 1, and the piezoelectric portion 1 is solidly attached to the ceramic substrate 2 directly or via the electrodes 3. The present piezoelectric element is described specifically below at every constituent.

The substrate 2 used in the present invention is of ceramics and preferably made of a material containing at least one kind selected from the group consisting of stabilized zirconium oxide, aluminum oxide, magnesium oxide, mullite, aluminum nitride, silicon nitride and glass, for the heat resistance, chemical stability and insulating property. Of these, particularly preferred is a material containing stabilized zirconium oxide, for the high mechanical strength and excellent tenacity.

The substrate 2 has a thickness of preferably 3 µm to 1 mm, more preferably 5 to 500 µm, particularly preferably 7 to 200 µm in the present invention.

When the thickness of the substrate 2 is less than 3 µm, the piezoelectric element may have a low mechanical strength; and when the thickness is more than 1 mm, the rigidity of the substrate relative to the shrinkage stress of the piezoelectric portion is large when a voltage is applied to the piezoelectric element, and the piezoelectric element may show a small flexural displacement.

Figure 2A:
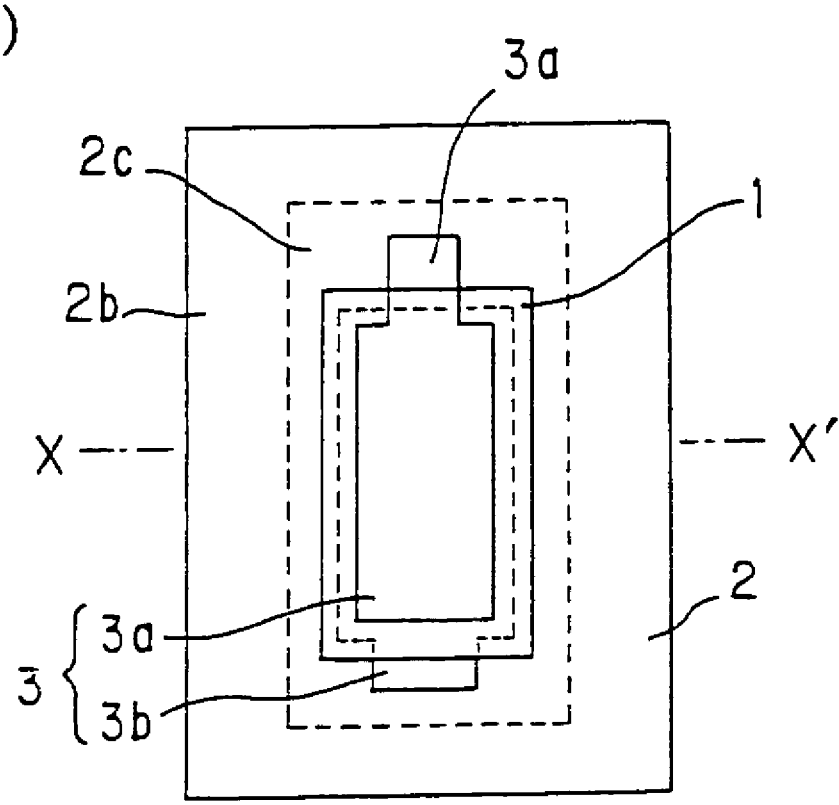
FIGS. 2(a) and 2(b) are explanatory views schematically showing another embodiment of the piezoelectric element of the present invention.
Figure 2B:
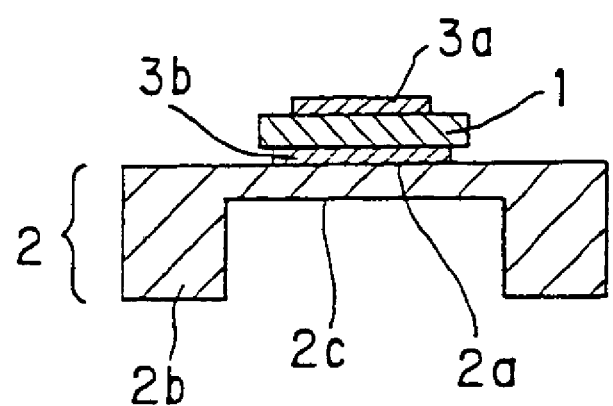

The substrate 2 may be produced so as to have, as shown in FIGS. 2(a) and 2(b), a thin portion 2c roughly corresponding to an interface 2a between piezoelectric portion 1 or electrode 3b and ceramic substrate 2 and having the aforementioned thickness and a thick portion 2b roughly corresponding to the surface area of ceramic substrate other than the interface 2a and having a larger thickness than the thin portion 2c.

Thereby, the piezoelectric element obtained can show a larger flexural displacement and a higher mechanical strength.

Figure 3A:
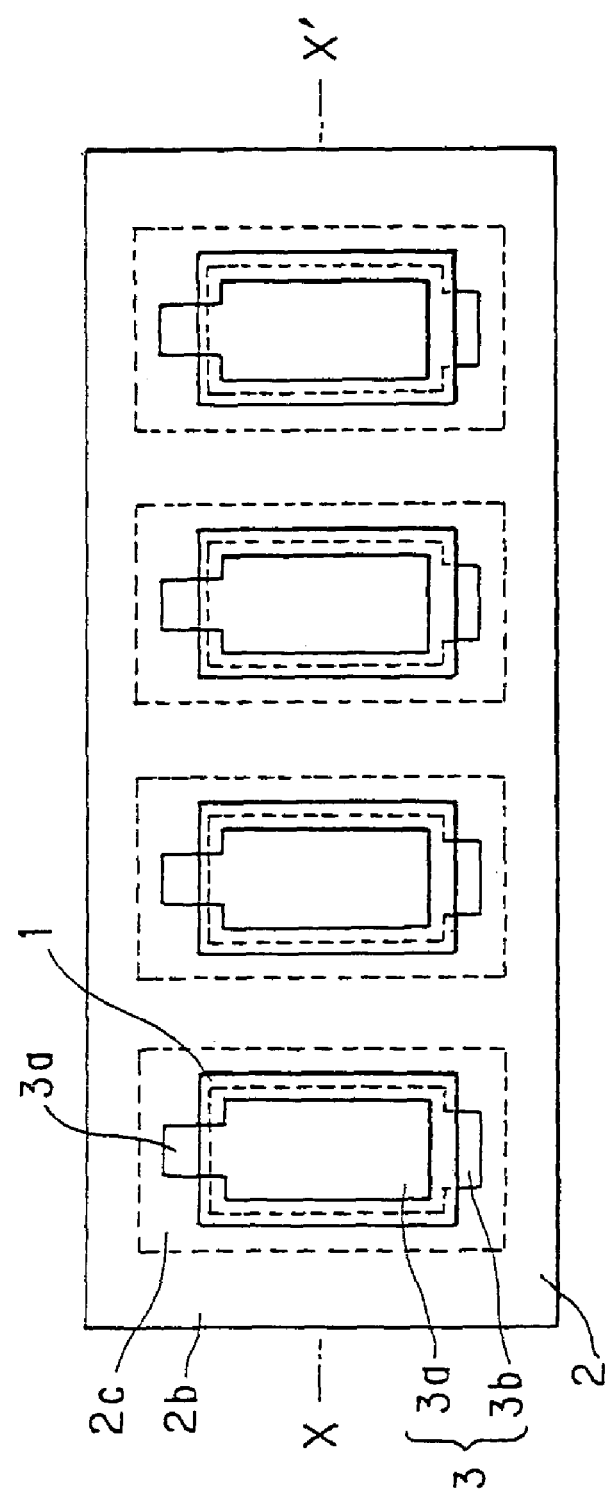
FIGS. 3(a) and 3(b) are explanatory views schematically showing still another embodiment of the piezoelectric element of the present invention.
Figure 3B:
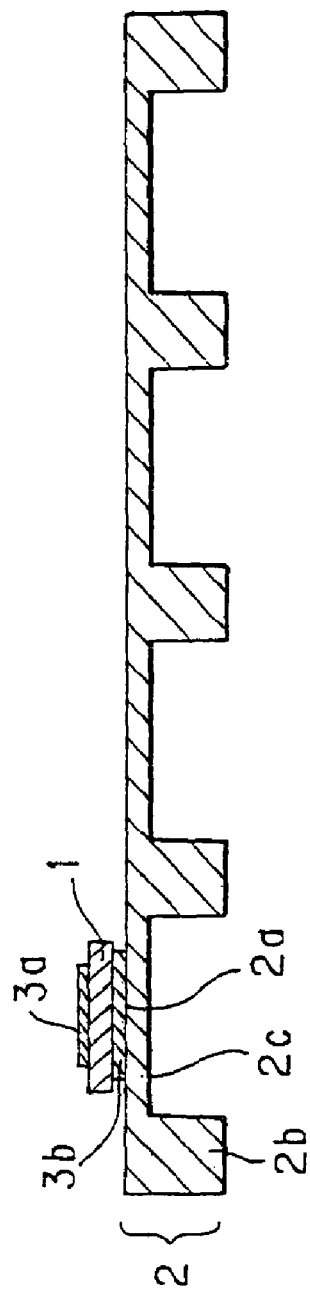

It is also possible that a plurality of units each having such a structure are provided on a single substrate 2, as shown in FIGS. 3(a) and 3(b).

There is no particular restriction as to the surface shape of the substrate 2 in the present invention. The surface shape may be, for example, a rectangle, a square, a triangle, an ellipse, a true circle, an edge-rounded square, an edge-rounded rectangle, a capsule or a combination thereof.

A cross-section of the substrate 2 in the thickness direction has a W-like shape having three inflection points in view of high linearity of a flexural displacement relative to an electric field.

The piezoelectric portion 1 used in the present invention is made of a piezoelectric ceramic composition composed mainly of a $PbMg_{1/3}Nb_{2/3}O_3$—$PbZrO_3$—$PbTiO_3$ ternary system solid solution composition represented by the following general chemical formula shown below and containing 0.05–10.0 mass % of NiO.

The piezoelectric ceramic composition is represented by: $Pb_x(Mg_{y/3}Nb_{2/3})_aTi_bZr_cO_3$.

In the above general chemical formula the following are satisfied: $0.95 \leq x \leq 1.05$; $0.8 \leq y \leq 1.0$; a, b and c are decimals falling in a range surrounded by (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in the coordinates with coordinate axes of said a, b and c, and a+b+c=1.00.

This enables to give a piezoelectric element having a dense piezoelectric portion even in the case that the piezoelectric element is solidly attached onto the substrate, having excellent piezoelectric properties, and having high linearity of a flexural displacement relative to an electric field up to a high electric field region.

The reason why, in the above general formula, that a, b and c are made to be within the aforementioned specific range, is that, if a, b and c are outside of the range, there occurs a deterioration in flexural displacement of the piezoelectric element and linearity of a flexural displacement relative to an electric field. Likewise, the reason why the NiO content in the piezoelectric ceramic composition is 0.05 to 10.0 mass % is that the NiO content in the piezoelectric ceramic composition of less than 0.05 mass % causes insufficient densification, thereby causing deterioration in flexural displacement of the piezoelectric element and linearity of a flexural displacement relative to an electric field. On the other hand, when the NiO content exceeds 10.0 mass %, the piezoelectric portion has a higher reactivity with the substrate, which also causes deterioration in flexural displacement of the piezoelectric element and linearity of a flexural displacement relative to an electric field.

Therefore, the NiO content in the piezoelectric ceramic composition used in the present invention is preferably 0.50 to 8.0 mass %, and more preferably 1.0 to 6.0 mass %.

In the present invention, Ni is preferably dispersed in the piezoelectric ceramic composition uniformly and more preferably in such a concentration gradient that the concentration of Ni becomes higher from the interface $2a$ between the piezoelectric portion and the substrate towards the thickness direction of the piezoelectric portion.

Thereby, the piezoelectric portion 1 can have a higher density even in the case that it is solidly attached to the substrate 2 directly or via an electrode.

In the present invention, it is preferable that at least a part of NiO in this piezoelectric ceramic composition is present as a particle having NiO as the main component.

The presence of such NiO particles enables to secure linearity of a flexural displacement relative to an electric field up to a high electric field region, and thereby a larger flexural displacement can be obtained in comparison with a conventional piezoelectric element with the same electric force.

In the present invention, particles having NiO as the main component are preferably present on the surface and/or in the interior of the piezoelectric portion (piezoelectric ceramic composition) in the point that linearity of a flexural displacement relative to an electric field can be ensured up to a higher electric field region, more preferably unevenly distributed on the surface of the piezoelectric portion (piezoelectric ceramic composition).

Here, "unevenly distributed" means "present on a surface or in the interior unevenly" and includes both "present more on a surface than in the interior though they are present on the surface and in the interior of a piezoelectric ceramic composition" and "present only on the surface."

In the present invention, there is no particular limitation on a particle diameter of particles having NiO as the main component. However, it is preferably 0.1–2 μm. In addition, particles having NiO as the main component may be of only NiO or of MgO of solid solution. However, the particles of MgO of solid solution is preferable in view of high linearity of a flexural displacement relative to an electric field. In addition, the particles having NiO as the main component may be present at a grain boundary of a piezoelectric ceramic composition or in grains of the piezoelectric ceramic composition.

Next, a piezoelectric ceramic composition in the present invention has an average particle diameter of 1–10 μm with a maximum particle diameter being 5 times as large as the average particle diameter or less, preferably an average particle diameter of 2–5 μm with a maximum particle diameter being 4 times as large as the average particle diameter or less, more preferably an average particle diameter of 2–5 μm with a maximum particle diameter being 3 times as large as the average particle diameter or less.

When the average particle diameter is less than 1 μm, the domain in the piezoelectric portion does not develop sufficiently, which causes deterioration in flexural displacement and linearity of a flexural displacement relative to an electric field in a high electric field region. When the average particle diameter is more than 10 μm, the domain in the piezoelectric portion is large but does not move easily, which may result in a small flexural displacement.

In addition, when the maximum particle diameter exceeds 5 times the length of the average particle diameter, coarse particles which polarization does not move easily increase, and thereby linearity of a flexural displacement relative to an electric field becomes low, and a flexural displacement itself becomes small.

In the present invention, it is preferred to replace the Pb in the piezoelectric ceramic composition by at least one kind of element selected from the group consisting of Sr, Ca, Ba and La for improvement in piezoelectric properties and linearity of a flexural displacement relative to the amount of an electric field.

However, replacement of Pb in the piezoelectric ceramic composition with a high rate causes deterioration in a flexural displacement, increase in influence of a flexural displacement on a temperature change, and deterioration in linearity of an amount of a flexural displacement. Therefore, the rate of replacement is preferably within a suitable range at every substituent element.

When the Pb in the piezoelectric ceramic composition is replaced by at least one kind of element selected from the group consisting of Sr, Ca and Ba, the Pb is replaced preferably by 2 to 10 mole %, more preferably 4 to 8 mole %. When the Pb in the piezoelectric ceramic composition is replaced by La, the Pb is replaced preferably by 0.2 to 1.0 mole %, more preferably 0.4 to 0.9 mole %.

In the present invention, the piezoelectric portion 1 contains a phase other than perovskite phase preferably by 20% by volume or less, more preferably by 10% by volume or less.

The piezoelectric portion 1 has a porosity of preferably 10% by volume or less, more preferably 5% by volume or less for ensuring a desired flexural displacement and mechanical strength and enhancing linearity of a flexural displacement relative to an electric field in a high electric field region.

The piezoelectric portion 1 in the present invention has a thickness of preferably 1 to 300 μm, more preferably 3 to 100 μm, particularly preferably 5 to 30 μm.

When the thickness of the piezoelectric portion 1 is less than 1 μm, even the piezoelectric portion made of the aforementioned specific piezoelectric ceramic composition is liable to be densified insufficiently. When the thickness is more than 300 μm, the stress to the substrate becomes relatively too large; in order to prevent the substrate fracture, the ceramic substrate needs to have a larger thickness, making it difficult to produce a small piezoelectric element.

The ratio of the thickness of the ceramic substrate 2 to the thickness of the piezoelectric portion 1 (the thickness of the substrate/the thickness of the piezoelectric portion) is preferably 0.1 to 30, more preferably 0.3 to 10, particularly preferably 0.5 to 5 from the point of ensuring mechanical strength and a desired flexural displacement.

In the present invention, any electrode 3 may be employed as long as it is electrically connected to the piezoelectric portion 1.

Figure 4A:
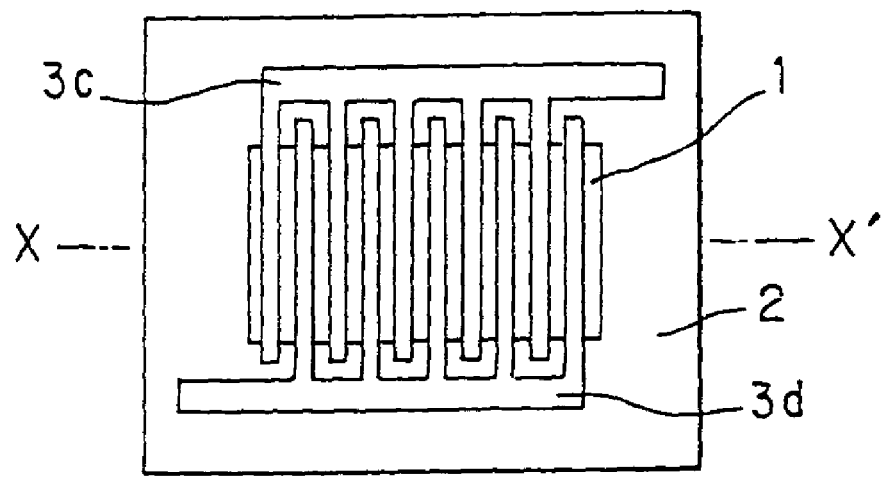
FIGS. 4(a) and 4(b) are explanatory views schematically showing still another embodiment of the piezoelectric element of the present invention.
Figure 4B:
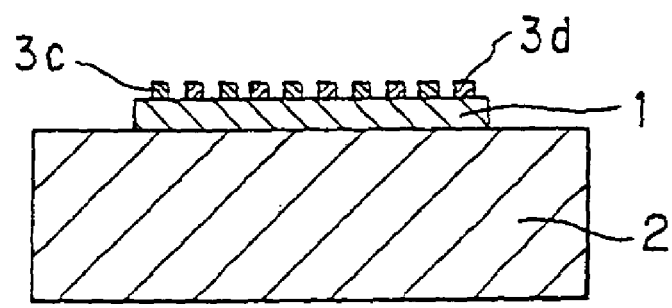
Figure 5A:
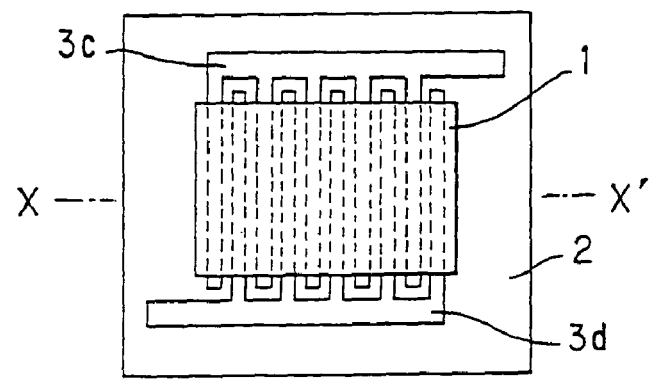
FIGS. 5(a) and 5(b) are explanatory views schematically showing still another embodiment of the piezoelectric element of the present invention.
Figure 5B:
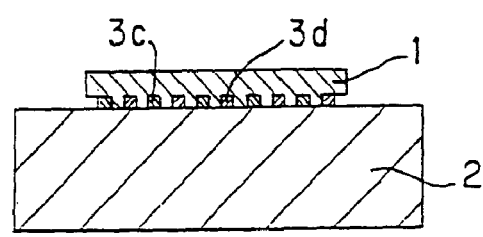

The electrodes 3 may be, for example, a pair of comb-shaped electrodes $3c$ and $3d$ formed on a piezoelectric portion 1 attached solidly to a substrate 2 as shown in FIGS. 4($a$) and 4($b$); or, may be a pair of comb-shaped electrodes $3c$ and $3d$ attached solidly to a substrate 2 with a piezoelectric portion 1 being solidly attached onto the electrodes $3c$ and $3d$ as shown in FIGS. 5($a$) and 5($b$).

Figure 6:
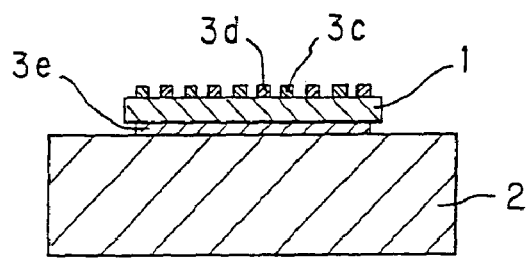
FIG. 6 is a sectional view schematically showing still another embodiment of the piezoelectric element of the present invention.
Figure 7:
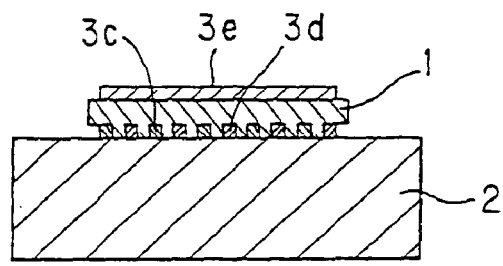
FIG. 7 is a sectional view schematically showing still another embodiment of the piezoelectric element of the present invention.

Alternatively, it is possible that, as shown in FIG. 6, on a pair of comb-shaped electrodes $3c$ and $3d$ solidly attached onto a substrate 2, a piezoelectric portion 1 is solidly attached, and a common electrode $3e$ is formed on a surface opposite to the surface of the piezoelectric portion 1 where the comb-shaped electrodes $3c$ and $3d$ are solidly attached. Conversely, it is also possible that, as shown in FIG. 7, on a common electrode 3e solidly attached onto a substrate 2, a piezoelectric portion 1 is solidly attached, and a pair of comb-shaped electrodes 3c and 3d are formed on a surface opposite to the surface of the piezoelectric portion 1 where the common electrode 3e is solidly attached.

Figure 8:
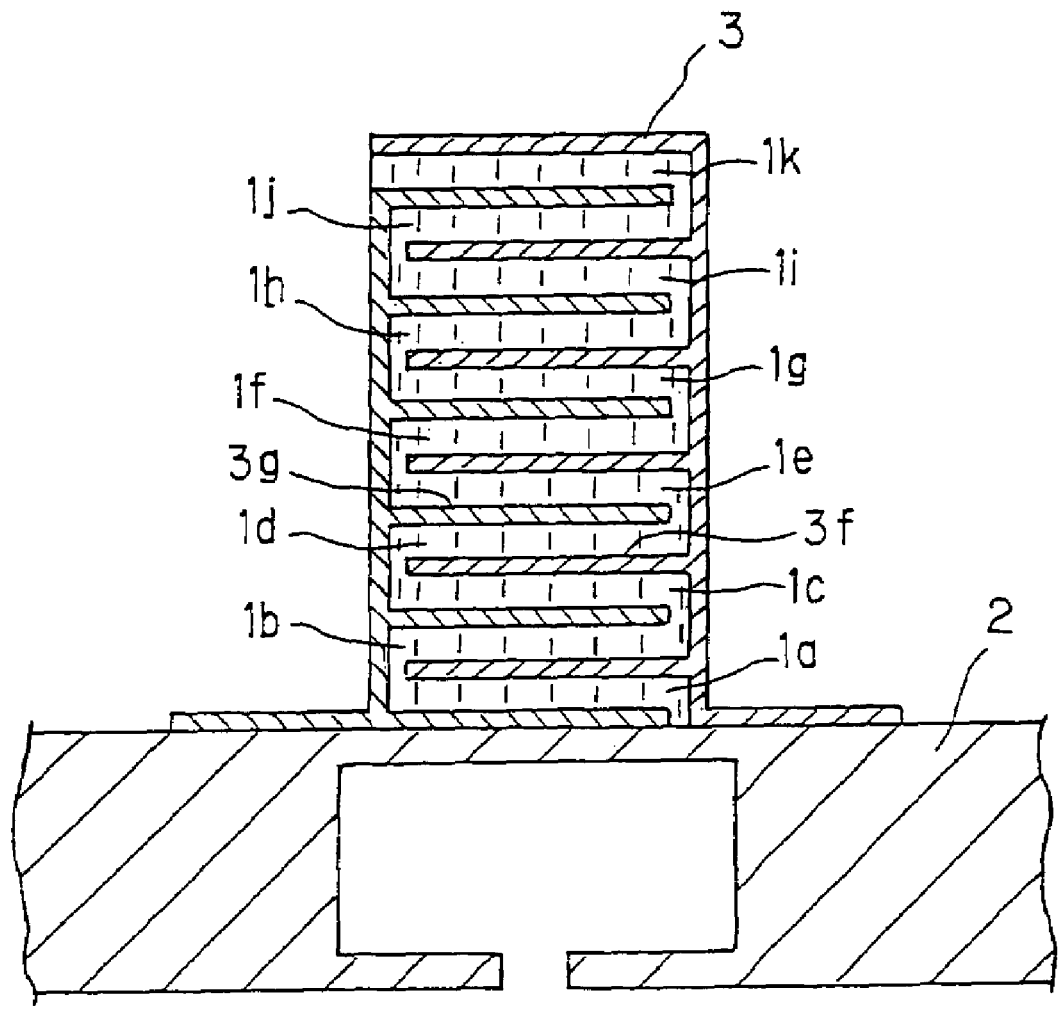
FIG. 8 is a sectional view schematically showing still another embodiment of the piezoelectric element of the present invention.

Further, in a layered piezoelectric element where a plurality of piezoelectric portions (1a–1k) are arranged in stories as shown in FIG. 8, it is preferable that a negative electrode 3f and a positive electrode 3g of the electrode 3 are alternatively disposed between the electrode portions (1a–1k).

At this time, a width of an electrode is preferably 60–90% of a width of a piezoelectric portion, and more preferably 70–80%. When a width of an electrode is less than 60% of a width of a piezoelectric portion, a flexural displacement becomes small because an area of the piezoelectric portion where an electric field is applied is small. When a width of an electrode is more than 90% of a width of a piezoelectric portion, positioning of the electrode requires precision, and bad precision upon positioning causes a short between electrodes or dielectric breakdown.

As the material for the electrodes 3, there is no limitation and may be employed, for example, a material made of at least one kind selected from the group consisting of platinum, palladium, rhodium, gold, silver and alloys thereof. Of these materials, platinum or an alloy composed mainly of platinum is preferred because they show high heat resistance during the heat-treatment of piezoelectric portion. A glass component may be added thereto further upon the heat treatment described below to make formation of an electrode easy. In the case of the aforementioned layered piezoelectric element, a material for each electrode may be the same among all electrodes or different in a part of or all the electrodes.

The thickness of electrodes 3 in the present invention is preferably 15 μm or less, more preferably 5 μm or less because, when the thickness is more than 15 μm, the electrodes 3 act as a relaxing layer, which may result in a small flexural displacement.

Next, the piezoelectric element of the present invention is characterized in that the piezoelectric portion 1 is solidly attached to the substrate 2 directly or via the aforementioned electrode.

Thereby, it is possible to prevent the reduction in vibration transmittability between ceramic substrate 2 and piezoelectric portion 1, caused by the interposition of adhesive or the like, and the deterioration in piezoelectric properties due to deterioration in properties of piezoelectric portion 1 and ceramic substrate 2 caused by the infiltration of adhesive components or the like.

Herein, "be solidly attached" refers to that the piezoelectric portion is tightly integrated with the ceramic substrate directly or via the electrode, owing to a solid-state reaction between the ceramic substrate and the piezoelectric portion or the electrode, without using any organic or inorganic adhesive.

Incidentally, in a layered piezoelectric element shown in FIG. 8, the piezoelectric portion 1a at the lowest portion is solidly attached to the substrate 2 directly or via the electrode 3g.

In a piezoelectric element of the present invention, the ratio of the capacity after polarization to the capacity before polarization is preferably 120% or more, more preferably 125% or more, in the point of an easily movable polarization structure.

Then, a method for producing a piezoelectric element of the present invention is described. In the production process of the present invention, first, a piezoelectric material made of a specific piezoelectric ceramic composition is superposed on a ceramic substrate or an electrode formed on a ceramic substrate.

The substrate used in the present invention can be produced by producing a compact having a desired shape by a general method of, for example, a press and an extrusion with using a material corresponding with the ceramics as described with respect to the piezoelectric element of the present invention and firing the compact under general firing conditions.

The piezoelectric material used in the present invention is made of a piezoelectric ceramic composition described with respect to the piezoelectric element of the present invention and can be prepared as follows.

That is, first, a raw material which serves as the main component of the piezoelectric ceramic composition is prepared by mixing simple substances (elements) each consisting of Pb, Ba, Ca, Sr, La, Mg, Nb, Zr or Ti; oxides of these elements (e.g. PbO, $Pb_3O_4$, $La_2O_3$, MgO, $Nb_2O_5$, $TiO_2$ and $ZrO_2$); carbonates of these elements (e.g. $BaCO_3$, $SrCO_3$, $MgCO_3$ and $CaCO_3$); and compounds containing a plurality of these elements (e.g. $MgNb_2O$) so that the contents of elements (Pb, Ba, Ca, Sr, La, Mg, Nb, Zr and Ti) in resulting mixture becomes within a desired ratio shown by the above-discussed general formula. The raw material has an average particle diameter of preferably 1 μm or less, more preferably 0.5 μm or less in the point that they can easily be uniformly mixed.

The mixture is mixed with 0.05–10.0 mass % of NiO relative to the whole composition, and the resulting mixed raw material is calcined at 750 to 1,300° C. to obtain a piezoelectric ceramic composition. The calcined piezoelectric ceramic composition has a ratio of a strength of the strongest diffraction ray of a pyrochlore phase to a strength of the strongest diffraction ray of a perovskite phase is preferably 5% or less, more preferably 2% or less.

Then, the piezoelectric ceramic composition obtained above is ground with a general grinding apparatus such as a ball mill, an attrition mill, or a beads mill to give a piezoelectric material powder having a desired particle diameter. At this time, the average particle diameter of the piezoelectric material powder is preferably 0.1–1.0 μm, more preferably 0.3–0.7 μm. In addition, the maximum particle diameter of the piezoelectric material powder is preferably 3.0 μm or less, and more preferably 2.0 μm or less. By such a particle diameter, a desired ternary system solid solution composition having an average particle diameter of 1–10 μm with a maximum particle diameter being 5 times as large as the average particle diameter or less.

Incidentally, a particle diameter of the powder may be adjusted by subjecting the piezoelectric material powder obtained by grinding to a heat treatment at 400–750° C. At this time, a finer particle is more preferable because a fine particle can be integrated with other particles to give a powder having an even particle diameter. The piezoelectric material may be prepared by another method, for example, an alkoxide method or a co-precipitation method.

The method for superposing the obtained piezoelectric material may be, for example, screen printing, spraying or dipping. Of these, screen printing is preferred because it enables continuous lamination easily in a shape and thickness of high accuracy.

In the case of solidly attaching a piezoelectric portion directly onto a substrate, a piezoelectric material is superposed directly on a substrate. In the case of solidly attaching a piezoelectric portion onto a substrate via an electrode, an electrode is formed on a substrate, and a piezoelectric material is superposed on the electrode.

As a method for forming the electrode, there can be mentioned, for example, screen printing, spraying and dipping. Of these, screen printing is preferred in view of the bondability between a ceramic substrate and a piezoelectric portion.

The formed electrode can be integrated with a substrate and/or a piezoelectric portion by a heat treatment of at about 1000–1400° C. At this time, the heat treatment may be conducted before a piezoelectric material is superposed, at the time when an electrode is formed, or collectively by a heat treatment conducted after a piezoelectric material is superposed as described below.

Next, in a production method of the present invention, the piezoelectric material superposed on the ceramic substrate or on the electrode is heat-treated in the co-presence of a specific amount of an atmosphere-controlling material having the same composition as the piezoelectric composition in a sealing atmosphere.

Thereby, it becomes possible to prevent the vaporization of each component constituting the piezoelectric material and obtain a piezoelectric portion containing each component at a desired ratio. This heat treatment enables to solidly attach the piezoelectric portion on a substrate directly or via an electrode.

In the present invention, the atmosphere-controlling material is made to coexist at preferably 0.03–0.05 mg/cm$^3$, more preferably 0.07–0.40 mg/cm$^3$, furthermore preferably 0.10–0.30 mg/cm$^3$ in terms of NiO amount per unit volume of a space in a container in the atmosphere.

When the amount in terms of NiO amount per unit volume of a space in a container in the atmosphere is less than 0.03 mg/cm$^3$, a piezoelectric element is prone to have a low linearity of a flexural displacement relative to an electric field upon applying a high electric field because it is difficult to obtain a piezoelectric portion containing a desired amount of Ni. On the other hand, when the amount in terms of NiO amount per unit volume of a space in a container in the atmosphere is more than 0.50 mg/cm$^3$, particles having NiO as the main component are excessively present and serves as the starting points of dielectric breakdown, therefore, dielectric breakdown is apt to be caused.

Incidentally, NiO can be dispersed uniformly in a piezoelectric portion by making a NiO content of a co-existing atmosphere-controlling material the same as an piezoelectric ceramic composition constituting a piezoelectric material, and NiO can be dispersed in such a concentration gradient that the concentration of NiO becomes higher from the interface between the piezoelectric portion and the ceramic substrate towards the thickness direction of the piezoelectric portion by giving a higher concentration to a piezoelectric ceramic composition constituting a piezoelectric material. In addition, by controlling the NiO content of the composition made to be co-exist, it becomes possible to control the extent of the NiO concentration gradient in the piezoelectric obtained.

In the present invention, it is also preferable to use, as a container for housing the piezoelectric element and a setter for mounting the piezoelectric element thereon, a member obtained by subjecting the member to a heat treatment (hereinbelow sometimes referred to simply as "pretreatment") in an atmosphere where an atmosphere-controlling material having the same composition as the piezoelectric material is coexisted.

By this, there can be securely obtained a piezoelectric portion containing a desired amount of NiO and a piezoelectric element having high linearity of a flexural displacement relative to an electric field up to a high electric field region.

In addition, in the present invention, it is particularly preferable to subject a piezoelectric material to a heat treatment with using the pretreated container and setter as well as to make a specific amount of the aforementioned atmosphere-controlling material co-exist.

Such a heat treatment gives a piezoelectric portion where a ceramic composition contains particles having NiO on the surface and in the interior thereof, and a piezoelectric element having a higher linearity of a flexural displacement relative to an electric field up to a high electric field region.

Incidentally, to make the particles having NiO as the main component unevenly distributed, a heat treatment is conducted in the same manner as in the aforementioned case that NiO is present in a piezoelectric portion with a concentration gradient under conditions where the particles can be formed.

It is preferable that a material for the container and the setter in the present invention contains, as the main component, magnesium oxide, aluminum oxide, zirconium oxide, mullite, or spinel.

The pretreatment is preferably conducted at a temperature within a range of ±100° C. from a temperature for heat treating a material for a piezoelectric portion superposed on a substrate or the like so that an effect due to the pretreatment is sufficiently exhibited.

The pretreatment is conducted preferably plural times, more preferably at least 3 times to make securely present particles having NiO as the main component on the surface and in the interior of the ceramic composition.

It is preferable to conduct a plural number of heat treatments on a piezoelectric material after the pretreatment is conducted once. It is also preferable to conduct a heat treatment on the piezoelectric material once after a plurality of pretreatments are conducted. It is also preferable to conduct a plurality of heat treatments on the piezoelectric material after a plurality of pretreatments are conducted.

In the present invention, the heat treatment temperature for the piezoelectric material is preferably 1,000 to 1,400° C., more preferably 1,100 to 1,350° C. When the temperature is less than 1,000° C., the solid attachment of the piezoelectric to the ceramic substrate may be insufficient or the density of the piezoelectric may be insufficient. When the temperature exceeds 1,400° C., the vaporization amount of Pb and Ni in the piezoelectric material is large and it may be difficult to obtain a piezoelectric having an intended composition.

In addition, the time for keeping the highest temperature of the heat treatment is preferably 10 min.–10 hours, more preferably 1 hour–4 hours. When the time is less than 10 min., densification of a piezoelectric ceramic composition and growth of particles is prone to become insufficient, and desired properties cannot be obtained in some cases. When the time is more than 10 hours, the gross vaporization amount of Pb and Ni increases even if the atmosphere is controlled; which is prone to cause disadvantage of lowering in properties and increase in dielectric breakdown.

Though the heat treatment may be conducted before formation of an electrode in the present invention, it may be conducted after the formation collectively. Likewise, in a layered piezoelectric element, each electrode and each piezoelectric portion may be heat-treated by every formation thereof, may be heat-treated after all of them are formed, or may be heat-treated repeatedly after some of them are formed.

The present invention is described more specifically below by way of Examples. However, the present invention is in no way restricted to these Examples. In the Examples and Comparative Examples, measurements were conducted as follows.

(Method of Evaluation)

1. Flexural Displacement

A voltage was applied to electrodes of a piezoelectric element so as to give an electric field of 3 kV/mm. The resulting flexural displacement of the piezoelectric element was measured by a laser displacement tester.

2. Linearity of Flexural Displacement Relative to Electric Field

There were measured a flexural displacement generated when a voltage was applied between the upper and the lower electrodes so as to give an electric field of 4 kV/mm and a displacement generated when a voltage was applied between the upper and the lower electrodes so as to give an electric field of 2 kV/mm. A ratio of the two values obtained by the measurements was evaluated. Incidentally, a higher linearity gives an evaluation nearer to 200%.

3. Average Particle Diameter and the Maximum Particle Diameter

A surface of a ternary system solid solution composition constituting a piezoelectric portion was measured with a scanning electron microscope. To be concrete, a line was drawn on an optional image for observation, a distance of a grain boundary across the line was defined as a particle diameter, particle diameters of 100 ternary system solid solution compositions were measured to determine the average particle diameter and the maximum particle diameter.

4. Porosity

The piezoelectric portion of each piezoelectric element obtained in Examples and Comparative Examples was examined by a scanning electron microscope, over a range of 50 μm of each of the surface, length and width; the areal proportion of pores in each of the three visual fields was determined; and the average of the three areal proportions was calculated and taken as the porosity of the piezoelectric portion.

5. Rate of Dielectric Breakdown

A rate of the number of piezoelectric elements having dielectric breakdown relative to the number of whole piezoelectric elements was evaluated as a rate of dielectric breakdown in the case that a voltage was applied between electrodes so as to give an electric field of 4 kV/mm.

EXAMPLE 1

A lower electrode [1.2 mm×0.8 mm×3 μm (thickness)] composed of platinum was formed, by screen printing, on a $Y_2O_3$-stabilized $ZrO_2$ substrate having a flat thin portion [dimensions of the thin portion: 1.6 mm×1.1 mm×10 μm (thickness) with a shape of cross-section in a longitudinal direction being rectangle (a surface where a piezoelectric portion or an electrode is flat)]. They were subjected to a heat treatment at 1300° C. for two hours to integrate the lower electrode with the substrate.

Thereon was superposed a piezoelectric material [1.3 mm×0.9 mm×13 μm (thickness)] made of a piezoelectric ceramic composition containing 98.5 mass % of $Pb_{1.00}(Mg_{1/3}Nb_{2/3})_{0.20}Ti_{0.43}Zr_{0.37}O_3$ having the average particle diameter of 0.49 μm and the maximum particle diameter of 1.8 μm and 1.5 mass % of NiO.

Then, the substrate having an electrode thereon and a piezoelectric material superposed thereon was subjected to a heat-treatment at 1,275° C. for 2 hours in the co-presence of an atmosphere-controlling material having the same composition as the piezoelectric material at the rate of 0.15 mg/cm$^3$ in terms of NiO per unit volume of the space in the container. The piezoelectric material after the heat treatment had a thickness of 10 μm.

At the time of the heat treatment, a container and a setter to be used was heat-treated (hereinbelow sometimes referred to as "pretreatment") once in the co-presence of an atmosphere-controlling material having the same composition as the piezoelectric material at the rate of 0.15 mg/cm$^3$ in terms of NiO per unit volume of the space in the container to be adapted to the atmosphere. Housing in the container and mounting on the setter were performed.

Then, on the piezoelectric portion was formed, by screen printing, an upper electrode [1.2 mm×0.8 mm×0.5 μm (thickness)] composed of gold. The resulting material was heat-treated to produce a piezoelectric element.

COMPARATIVE EXAMPLE 1

A piezoelectric element was produced in the same manner as in Example 1 except that there was used a piezoelectric material made of a piezoelectric ceramic composition containing 98.5 mass % of $Pb_{1.00}(Mg_{1/3}Nb_{2/3})_{0.20}Ti_{0.43}Zr_{0.37}O_3$ having the average particle diameter of 0.62 μm and the maximum particle diameter of 5.5 μm and 1.5 mass % of NiO.

(Evaluation)

A piezoelectric element of Example 1 had an average particle diameter of 3.0 μm, the maximum particle diameter of 8.7 μm, the ratio of the 4 kV/mm flexural displacement to the 2 kV/mm flexural displacement (hereinbelow sometimes referred to as "4/2 flexural displacement ratio) was 170%, which shows high linearity of a flexural displacement relative to an electric field. In addition, the flexural displacement itself was so large as 2.23 μm.

In contrast, the piezoelectric element of Comparative Example 1 had a 4/2 flexural displacement ratio of 146%, which shows low linearity of a flexural displacement relative to an electric field. The flexural displacement itself was also so small as 1.75 μm. The results are collectively shown in Table 1.

TABLE 1

| | NiO content (mass %) | Average particle diameter (μm) | Maximum particle diameter (μm) | 4/2 flexural displacement ratio (%) | Flexural displacement (μm) |
| --- | --- | --- | --- | --- | --- |
| Example 1 | 1.5 | 3.0 | 8.7 | 170 | 2.23 |
| Comp. Ex. 1 | 1.5 | 3.0 | 19.8 | 146 | 1.75 |

EXAMPLE 2

A piezoelectric element was produced in the same manner as in Example 1 except that a negative electrode, a piezoelectric material, a positive electrode, a piezoelectric material and a negative electrode were superposed on a substrate in this order so as to interpose a negative electrode and a positive electrode between two piezoelectric portions alternatively, that the lowest piezoelectric portion was solidly attached to the substrate via an electrode, that the thickness when piezoelectric materials were superposed was half of Example 1, and that the thickness of each piezoelectric portion was 5 µm (10 µm in total like Example 1).

(Evaluation)

A piezoelectric element of Example 2, which has a half thickness of each piezoelectric portion and the number of layers of 2, had a 4/2 flexural displacement ratio of 165%, showing lower linearity of a flexural displacement relative to an electric field in comparison with a piezoelectric element of Example 1. However, its flexural displacement increased to 2.45 µm contrariwise. The results are shown in Table 2 collectively.

TABLE 2

| | Thickness of each piezo-electric portion (µm) | Number of layers of piezoelectric portion | 4/2 flexural displacement ratio (%) | Flexural displacement (µm) |
|---|---|---|---|---|
| Example 1 | 10 | 1 | 170 | 2.23 |
| Example 2 | 5 | 2 | 165 | 2.45 |

REFERENCE EXAMPLES 1 TO 3

Piezoelectric elements were produced in the same manner as in Example 1 except that there were used, as piezoelectric materials, those obtained by mixing 97% by volume, 93% by volume or 85% by volume of a piezoelectric ceramic composition containing 98.5 mass % of $Pb_{1.00}(Mg_{1/3}Nb_{2/3})_{0.20}Ti_{0.43}Zr_{0.37}O_3$ and 1.5 mass % of NiO), with 3% by volume, 7% by volume or 15% by volume of a latex having particle diameters of 8 to 12 µm.

(Evaluation)

A piezoelectric element of Reference Example 3 (15% by volume of a latex is mixed in a piezoelectric material) had a porosity of 22%. At that time, the 4/2 flexural displacement ratio was 138%, and a flexural displacement itself was 1.66 µm. Likewise, a piezoelectric element of Reference Example 2 (7% by volume of a latex is mixed in a piezoelectric material) had a porosity of 12%. At that time, the 4/2 flexural displacement ratio was 154%, and a flexural displacement itself was 1.98 µm. In addition, a piezoelectric element of Reference Example 1 (3% by volume of a latex is mixed in a piezoelectric material) had a porosity of 6%. At that time, the 4/2 flexural displacement ratio was 162%, and a flexural displacement itself was 2.10 µm. From the above, it was confirmed that, as the porosity becomes smaller, the linearity of the flexural displacement to an electric field becomes higher, and the flexural displacement itself becomes larger. The results are collectively shown in Table 3.

TABLE 3

| | Latex (vol %) | Porosity (%) | 4/2 flexural displacement ratio (%) | Flexural displacement (µm) |
|---|---|---|---|---|
| Reference Numeral 1 | 3 | 6 | 162 | 2.10 |
| Reference Numeral 2 | 7 | 12 | 154 | 1.98 |
| Reference Numeral 3 | 15 | 22 | 138 | 1.66 |

EXAMPLE 3, AND COMPARATIVE EXAMPLE 2, 3

As shown in Table 4, a piezoelectric element was produced in the same manner as in Example 1 except that piezoelectric materials each containing 1.5 mass %, 0.03 mass %, or 15.0 mass % of NiO in a piezoelectric ceramic composition.

(Evaluation)

A piezoelectric element of Example 3 containing 1.5 mass % of NiO had a 4/2 flexural displacement ratio of 170%, which shows a high linearity of flexural displacement relative to electric field like a piezoelectric element of Example 1. In addition, the flexural displacement itself was 2.23 µm which was large like a piezoelectric element of the Example 1.

In contrast, a piezoelectric element of Comparative Example 2 containing a small amount (0.03 mass %) of NiO in a piezoelectric material had a 4/2 flexural displacement ratio of 144%, which shows low linearity of a flexural displacement relative to an electric field, and the flexural displacement itself was small (1.88 µm).

A piezoelectric element of Comparative Example 3 containing a large amount (15.0 mass %) of NiO in a piezoelectric material had a 4/2 flexural displacement ratio of 127%, which shows a lower linearity of a flexural displacement relative to an electric field, and the flexural displacement itself is the smallest (1.45 µm). The results are shown in Table 4.

TABLE 4

| | NiO content (mass %) | 4/2 flexural displacement ratio (%) | Flexural displacement (µm) |
|---|---|---|---|
| Example 3 | 1.5 | 170 | 2.23 |
| Comparative Example 2 | 0.03 | 144 | 1.88 |
| Comparative Example 3 | 15.0 | 127 | 1.45 |

EXAMPLE 4–6

A piezoelectric element was produced in the same manner as in Example 1 except that a piezoelectric ceramic composition containing 98.5 mass % of $Pb_{1.00}(Mg_{0.97/3}Nb_{2/3})_{0.20}Ti_{0.43}Zr_{0.37}O_3$ and 1.5 mass % of NiO was superposed as a piezoelectric material in Examples 4–6.

(Evaluation)

In Example 4, where the heat treatment was conducted in the same atmosphere with using a container and a setter subjected to a pretreatment 3 times in the co-presence of 0.15 mg/cm³ of an atmosphere-controlling material in terms of a NiO amount per unit volume of a space in a container, the 4/2 flexural displacement ratio was 174%, showing very high linearity of a flexural displacement, and a flexural displacement itself was very high (2.25 µm). In addition, the dispersion state of NiO in a piezoelectric portion was examined by an EPMA analysis, which indicated that particles having NiO as the main component were present both on a surface and in the interior of the piezoelectric portion and that also MgO is present in the particles having NiO as the main component.

On the other hand, in Example 5, where the heat treatment was conducted in the co-presence of 0.10 mg/cm³ of an atmosphere-controlling material in terms of a NiO amount per unit volume of a space in a container with using a container and a setter subjected to a pretreatment once in the co-presence of 0.15 mg/cm³ of an atmosphere-controlling material in terms of a NiO amount per unit volume of a space in a container, the 4/2 flexural displacement ratio was 171%, showing lower linearity of a flexural displacement relative to an electric field in comparison with that of the piezoelectric element in Example 4, and in addition, a flexural displacement itself was smaller (2.17 μm) than that of a piezoelectric element in Example 4. In addition, the dispersion state of NiO in a piezoelectric portion was examined by an EPMA analysis, which indicated that particles having NiO as the main component were not present in the interior of the piezoelectric portion though they were present on a surface of the piezoelectric portion.

Further, in Example 6, where the heat treatment was conducted in the co-presence of 0.10 mg/cm³ of an atmosphere-controlling material without a pretreatment in terms of a NiO amount per unit volume of a space in a container, the 4/2 flexural displacement ratio was 159%, showing lower linearity of a flexural displacement relative to an electric field, and in addition, a flexural displacement itself was further smaller (1.98 μm). In addition, the dispersion state of NiO in a piezoelectric portion was examined by an EPMA analysis, which indicated that particles having NiO as the main component were not present either on a surface or in the interior of the piezoelectric portion. The results are collectively shown in Table 5.

(Evaluation)

Each of the piezoelectric elements was measured for 4/2 flexural displacement ratio, and any piezoelectric element in Examples 7–10 had relatively high linearity of a flexural displacement relative to an electric field (158% or more).

However, a piezoelectric element of Example 8 employing a piezoelectric material having a composition where 5.0 mol % of Pb was substituted by Sr and a piezoelectric element of Example 9 employing a piezoelectric material having a composition where 10.0 mol % of Pb was substituted by Ba had a 4/2 flexural displacement ratio of 168% and 166%, respectively, showing higher linearity of a flexural displacement relative to an electric field in comparison with a piezoelectric element of Example 7 employing a piezoelectric material having a composition where Pb is not substituted at all. In addition, flexural displacements themselves were larger (2.38 m and 2.34 m, respectively) in comparison with that of a piezoelectric element of Example 7.

On the other hand, a piezoelectric element of Example 10 employing a piezoelectric material having a composition where 7.5 mol % of Pb was substituted by Sr, and other 7.5 mol % of Pb was substituted by Ca (15 mol % in total) had a 4/2 flexural displacement ratio of 158%, showing lower

TABLE 5

| | Atmosphere-controlling material in terms of NiO amount per unit volume of space in container (mg/cm³) | | Number of pretreatment | 4/2 flexural displacement ratio (%) | Flexural displacement (μm) | Presence of particles having NiO as the main composition in piezoelectric portion | |
|---|---|---|---|---|---|---|---|
| | Upon heat treatment | Upon pretreatment | | | | Surface | Interior |
| Ex. 4 | 0.15 | 0.15 | 3 | 174 | 2.25 | Present | Present |
| Ex. 5 | 0.1 | 0.15 | 1 | 171 | 2.17 | None | Present |
| Ex. 6 | 0.1 | — | 0 | 159 | 1.98 | None | None |

EXAMPLE 7–10

A piezoelectric element was produced in the same manner as in Example 1 except that a piezoelectric material having a composition shown in Table 6 was used.

linearity of a flexural displacement relative to an electric field in comparison with a piezoelectric element of Example 7. In addition, the flexural displacement itself was smaller (2.11 μm) than that of a piezoelectric element of Example 7. The results are collectively shown in Table 6.

TABLE 6

| | Example 7 | Example 8 | Example 9 | Example 10 |
|---|---|---|---|---|
| $Pb_x(Mg_{y/3}Nb_{2/3})_aTi_bZr_cO_3$ Pb-substituent | | | | |
| Sort of element | None | Sr | Ba | Ba, Ca |
| ratio (mol %) | — | 5.0 | 10.0 | 7.5, 7.5 |
| x | 1.00 | 1.00 | 1.00 | 1.00 |
| y | 0.97 | 0.97 | 0.97 | 0.97 |
| a | 0.375 | 0.375 | 0.375 | 0.375 |
| b | 0.375 | 0.375 | 0.375 | 0.375 |
| c | 0.250 | 0.250 | 0.250 | 0.250 |
| NiO content (mass %) | 1.0 | 1.0 | 1.0 | 1.0 |
| 4/2 flexural displacement ratio (%) | 162 | 168 | 166 | 158 |
| Flexural displacement (μm) | 2.31 | 2.38 | 2.34 | 2.11 |

EXAMPLES 11–13

A piezoelectric element was produced in the same manner as in Example 1 except that a piezoelectric material having a composition shown in Table 7 was used.

(Evaluation)

Any of the piezoelectric elements in Examples 11–13 had a 4/2 flexural displacement ratio of 159 or more, showing relatively high linearity of a flexural displacement relative to an electric field.

However, a piezoelectric element of Example 12 employing a piezoelectric material where 0.8 mol % of Pb is substituted by La had a 4/2 flexural displacement ratio of 167%, showing higher linearity of a flexural displacement relative to an electric field in comparison with that of a piezoelectric element of Example 11 employing a piezoelectric material where a part of Pb was not substituted by La. In addition, the flexural displacement itself was large (2.36 µm) in comparison with that of the piezoelectric element in Example 11.

On the other hand, a piezoelectric element of Example 13 employing a piezoelectric material where 1.5 mol % of Pb is substituted by La had a 4/2 flexural displacement ratio of 159%, showing lower linearity of a flexural displacement relative to an electric field in comparison with that of a piezoelectric element of Example 11. In addition, the flexural displacement itself was small (2.06 µm) in comparison with that of the piezoelectric element in Example 11. The results are shown in Table 7.

TABLE 7

|  | Example 11 | Example 12 | Example 13 |
|---|---|---|---|
| $Pb_x(Mg_{y/3}Nb_{2/3})_aTi_bZr_cO_3$ Pb-substituent | | | |
| Sort of element | None | La | La |
| ratio (mol %) | — | 0.8 | 1.5 |
| x | 1.00 | 1.00 | 1.00 |
| y | 0.97 | 0.97 | 0.97 |
| a | 0.375 | 0.375 | 0.375 |
| b | 0.375 | 0.375 | 0.375 |
| c | 0.250 | 0.250 | 0.250 |
| NiO content (mass %) | 1.0 | 1.0 | 1.0 |
| 4/2 flexural displacement ratio (%) | 162 | 167 | 159 |
| Flexural displacement (µm) | 2.31 | 2.36 | 2.06 |

COMPARATIVE EXAMPLES 4, 5

A piezoelectric element was produced in the same manner as in Example 1 except that a heat treatment was conducted in the co-presence of an atmosphere-controlling material at the rate of 0.750 mg/cm³ and 0.015 mg/cm³, respectively, in terms of NiO amount per unit volume of a space in a container in the atmosphere and that a pretreatment was not conducted.

(Evaluation)

A piezoelectric element of Comparative Example 4, where a heat treatment was conducted in the co-presence of an atmosphere-controlling material at the rate of 0.750 mg/cm³, had a relatively high linearity of a flexural displacement (162% of a 4/2 flexural displacement ratio). However, a dielectric breakdown ratio was 17%, which was higher than that of a piezoelectric element of Example 1.

A piezoelectric element of Comparative Example 5, where a heat treatment was conducted in the co-presence of an atmosphere-controlling material at the rate of 0.015 mg/cm³ in terms of NiO amount per unit volume of a space in a container, had a lower linearity of a flexural displacement (139% of a 4/2 flexural displacement ratio) than that of a piezoelectric element of Example 1. The results are collectively shown in Table 8.

TABLE 8

|  | NiO conversion amount per unit volume of space in container (mg/cm³) | 4/2 flexural displacement ratio (%) | Dielectric breakdown ratio (%) |
|---|---|---|---|
| Example 1 | 0.15 | 170 | 2 |
| Comp. Ex. 4 | 0.75 | 162 | 17 |
| Comp. Ex. 5 | 0.015 | 139 | 3 |

EXAMPLE 14

A piezoelectric element was produced in the same manner as in Example 1 except that a substrate having a W-like sectional shape in a thickness direction was used.

(Evaluation)

A piezoelectric element of Example 14, where a substrate a W-like sectional shape in a thickness direction was used, had a higher linearity of a flexural displacement relative to an electric field (177% of a 4/2 flexural displacement ratio) than that of a piezoelectric element of Example 1, where a substrate having a rectangle sectional shape in a thickness direction (a plane where a piezoelectric portion or an electrode is solidly attached is flat). In addition, a flexural displacement itself was large (2.48 µm) in comparison with a piezoelectric element of Example 1. The results are collectively shown in Table 9.

TABLE 9

|  | Shape of ceramic substrate | 4/2 flexural displacement ratio (%) | flexural displacement (µm) |
|---|---|---|---|
| Example 1 | Rectangular | 170 | 2.23 |
| Example 14 | W-like shape | 177 | 2.48 |

As described above, according to the present invention, there can be provided a piezoelectric element which has very high piezoelectric properties, excellent vibration transmittability between a substrate and a piezoelectric portion, and high linearity of a flexural displacement relative to an electric field, and a method for production thereof. In particular, these effects are great in a piezoelectric element having a layered structure a plurality of piezoelectric portions and electrodes disposed alternatively, and the piezoelectric element can be suitably used for an actuator, a sensor, etc.

The invention claimed is:

1. A method for producing a piezoelectric element comprising the steps of:
   providing a ceramic substrate;
   superposing a piezoelectric material on one of said ceramic substrate and an electrode formed on said ceramic substrate, said piezoelectric material having a piezoelectric ceramic composition comprising a $PbMg_{1/3}Nb_{2/3}O_3$—$PbZrO_3$—$PbTiO_3$ ternary system solid solution composition as a main component, represented by a general formula of $Pb_x(Mg_{y/3}Nb_{2/3})_aTi_bZr_cO_3$, wherein $0.95 \leq x \leq 1.05$; $0.8 \leq y \leq 1.0$, and a, b and c are decimals in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in coordinates having coordinate axes of said a, b and c values, wherein a+b+c=1.00, said piezoelectric composition also including 0.05 to 10.0 mass % of NiO;

providing a container defining a space having a volume and including an atmosphere, said atmosphere comprising an atmosphere-controlling material having the same composition as said piezoelectric material and including 0.03 to 0.5 mg/cm$^3$ of NiO per unit volume of said space; and subjecting said superposed piezoelectric material to a thermal treatment in said atmosphere.

2. A method for producing a piezoelectric element comprising the steps of:

providing a ceramic substrate having an electrode formed thereon;

superposing a piezoelectric material on said electrode formed on said ceramic substrate, said piezoelectric material having a piezoelectric ceramic composition comprising a $PbMg_{1/3}Nb_{2/3}O_3$—$PbZrO_3$—$PbTiO_3$ ternary system solid solution composition as a main component, represented by a general formula of $Pb_x(Mg_{y/3}Nb_{2/3})_aTi_bZr_cO_3$, wherein $0.95 \leq x \leq 1.05$; $0.8 \leq y \leq 1.0$, and a, b and c are decimals in a range of (a,b,c)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in coordinates having coordinate axes of said a, b and c values, wherein a+b+c=1.00, said piezoelectrc composition also including 0.05 to 10.0 mass % of NiO;

providing a container defining a space having a volume and including an atmosphere and a setter provided within said space, said atmosphere comprising an atmosphere-controlling material having the same composition as said piezoeLectric material and including 0.03 to 0.5 mg/cm$^3$ of NiO per unit volume of said space;

providing said superposed piezoeleetric material within said space of said container; and subjecting said superposed piezoelectric material to a thermal treatment in said atmosphere.

* * * * *